(12) United States Patent
Deng et al.

(10) Patent No.: US 11,545,934 B2
(45) Date of Patent: Jan. 3, 2023

(54) OSCILLATING SIGNAL GENERATOR CIRCUIT

(71) Applicant: REALTEK SEMICONDUCTOR CORPORATION, Hsinchu (TW)

(72) Inventors: Ping-Yuan Deng, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 3 days.

(21) Appl. No.: 17/153,644

(22) Filed: Jan. 20, 2021

(65) Prior Publication Data

US 2022/0149786 A1  May 12, 2022

(30) Foreign Application Priority Data

Nov. 10, 2020  (TW) ................................. 109139173

(51) Int. Cl.
*H03B 5/24*  (2006.01)

(52) U.S. Cl.
CPC ......... *H03B 5/24* (2013.01); *H03B 2200/004* (2013.01); *H03B 2200/0088* (2013.01)

(58) Field of Classification Search
CPC ................ H03B 5/24; H03B 2200/004; H03B 2200/0088
See application file for complete search history.

(56) References Cited

U.S. PATENT DOCUMENTS

| | | | |
|---|---|---|---|
| 6,538,499 B1 * | 3/2003 | Lu | ............................ H03L 7/06 327/156 |
| 6,853,262 B2 | 2/2005 | Feilkas et al. | |
| 7,015,768 B1 | 3/2006 | Talwalkar | |
| 7,042,302 B2 | 5/2006 | Chien | |
| 7,369,009 B2 * | 5/2008 | Hofer | ...................... H04L 27/12 331/116 R |
| 8,981,862 B2 | 3/2015 | Liu et al. | |

(Continued)

OTHER PUBLICATIONS

Frequency dependence on bias current in 5-GHz CMOS VCOs: Impact on tuning range and flicker noise upconversion. IEEE Journal of Solid-State Circuits, vol. 37, No. 8, Aug. 2002.

(Continued)

*Primary Examiner* — Jeffrey M Shin
(74) *Attorney, Agent, or Firm* — WPAT, P.C., Intellectual Property Attorneys; Anthony King

(57) ABSTRACT

An oscillating signal generator circuit includes an oscillator circuit, a feedback circuit, and a voltage regulator circuit. The oscillator circuit is configured to generate a first and second oscillating signal at a first and second output terminal according to a first reference voltage. The first and second oscillating signals are a differential pair of signals. The oscillator circuit includes a common mode sensing circuit coupled between the first and second output terminals. The common mode sensing circuit is configured to sense a common mode component of the first and second oscillating signals so as to generate a sense voltage. The feedback circuit, coupled to the common mode sensing circuit, is configured to generate a feedback voltage according to the sense voltage. The voltage regulator circuit is coupled to the oscillator circuit and the feedback circuit, and configured to regulate a supply voltage so as to generate the first reference voltage.

20 Claims, 6 Drawing Sheets

(56) References Cited

U.S. PATENT DOCUMENTS 9,344,036 B1\* 5/2016 Chang .................. H03B 5/1278
2005/0212611 A1\* 9/2005 Muthali ............... H03B 5/1215
　　　　　　　　　　　　　　　　　　　　　　331/117 R

OTHER PUBLICATIONS

A 1-V 3.8-5.7-GHz wide-band VCO with differentially tuned accumulation MOS varactors for common-mode noise rejection in CMOS SOI technology IEEE Transactions on Microwave Theory and Techniques, vol. 51, No. 8, Aug. 2003.

\* cited by examiner

OSCILLATING SIGNAL GENERATOR CIRCUIT

CROSS-REFERENCE TO RELATED APPLICATIONS

This application claims the benefit of priority to Patent Application No. 109139173, filed in Taiwan on Nov. 10, 2020, which is incorporated by reference in its entirety.

TECHNICAL FIELD

The present application relates to an oscillating signal generator circuit; in particular, to an oscillating signal generator circuit using a feedback circuit to cancel noises.

BACKGROUND

When an oscillator generates an oscillation signal, a voltage regulator circuit and a bias current source are required for operation. The voltage regulator circuit provides the supply voltage required by the oscillator, and the bias current source provides the bias current to the oscillator. However, the supply voltage source of the regulator circuit, the bias current source, and the chip on which the oscillator is located can all create noises coupled in the oscillation signal, thereby deteriorating the phase noise in the oscillation signal. When the sensitive gain of the oscillator is reduced, the noise coupled in the oscillation signal can be reduced, but the oscillator's frequency tuning range is also reduced. Therefore, how to reduce the noise coupled in the oscillator signal without reducing the oscillator's sensitive gain has become one of the most important issues to be solved in this field.

SUMMARY OF THE INVENTION

Some embodiments of the present disclosure provide an oscillating signal generator circuit including an oscillator circuit, a feedback circuit, and a voltage regulator circuit. The oscillator circuit has a first output terminal and a second output terminal, and configured to generate a first oscillating signal and a second oscillating signal respectively at the first output terminal and the second output terminal according to a first reference voltage. The first oscillating signal and the second oscillating signal are a differential pair of signals. The oscillator circuit comprises a common mode sensing circuit coupled between the first output terminal and the second output terminal, and the common mode sensing circuit is configured to sense a common mode component of the first oscillating signal and the second oscillating signal, so as to generate a sense voltage. The feedback circuit is coupled to the common mode sensing circuit and configured to generate a feedback voltage according to the sense voltage. The voltage regulator circuit is coupled to the oscillator circuit and the feedback circuit, and configured to regulate a supply voltage according to the feedback voltage and a second reference voltage, so as to generate the first reference voltage.

Some embodiments of the present disclosure provide an oscillating signal generator circuit including a first amplifier, a pass transistor, an oscillator circuit, and a feedback circuit. A control terminal of the pass transistor is coupled to an output terminal of the first amplifier, a first terminal of the pass transistor is configured to receive a supply voltage and a second terminal of the pass transistor is configured to output a first reference voltage. An input terminal of the oscillator circuit is configured to receive the first reference voltage, a first output terminal and a second output terminal of the oscillator circuit are configured to output a first oscillating signal and a second oscillating signal, respectively. A common mode node of the oscillator circuit is configured to output a sense voltage. The sense voltage has a common mode component of the first oscillating signal and the second oscillating signal. An input terminal of the feedback circuit is coupled to the common mode node, and an output terminal of the feedback circuit is coupled to a first input terminal of the first amplifier.

Compared with conventional technology, the oscillating signal generator circuit according to the present application can reduce noise coupled in the output oscillating signal without reducing the sensitive gain of the oscillator circuit.

DETAILED DESCRIPTION

Figure 1:
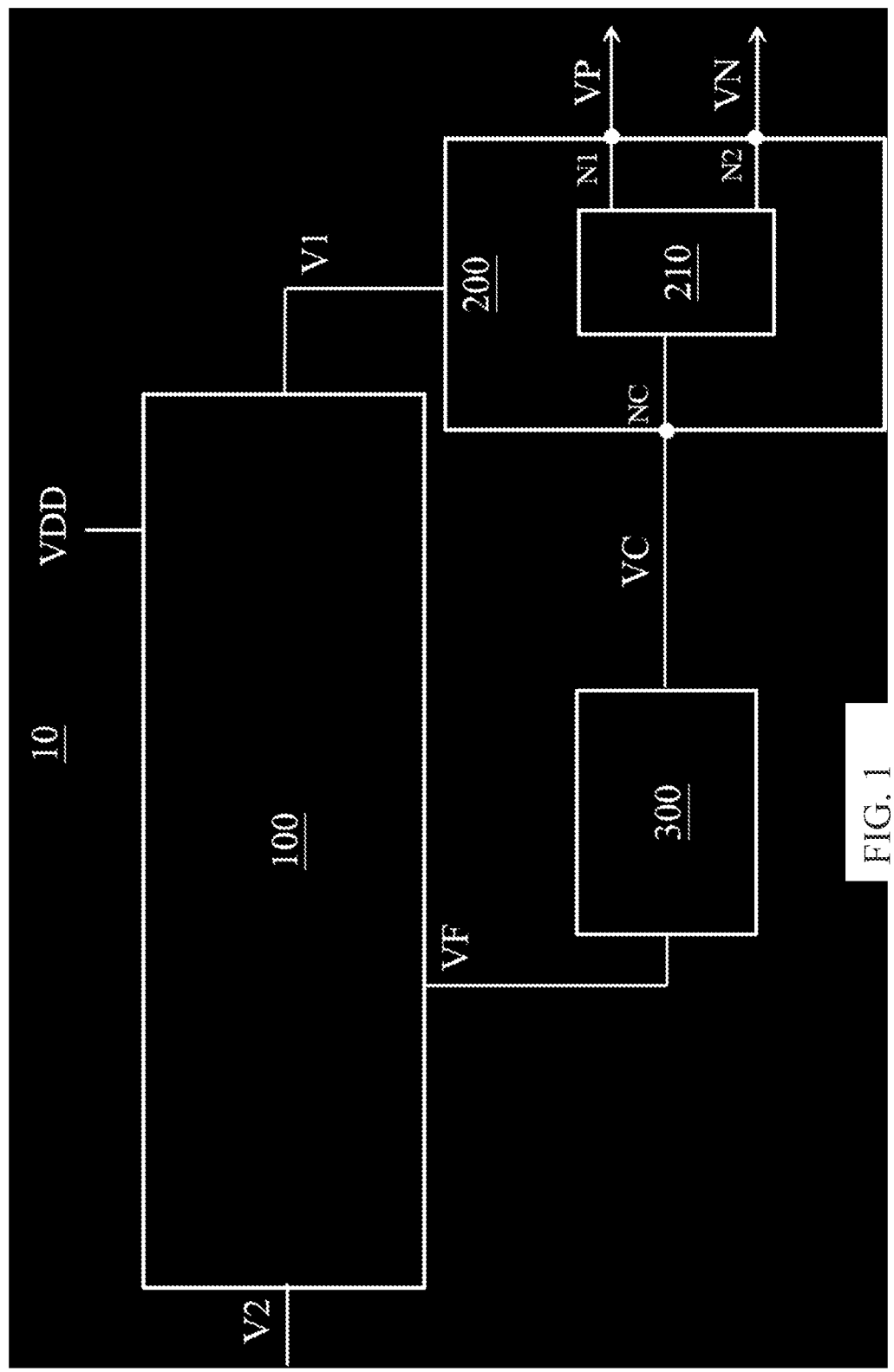
FIG. 1 is a block diagram illustrating an oscillating signal generator circuit according to some embodiments of the present application.

FIG. 1 is a block diagram illustrating an oscillating signal generator circuit 10 according to some embodiments of the present application. The oscillating signal generator circuit 10 includes a voltage regulator circuit 100, an oscillator circuit 200 and a feedback circuit 300. The oscillating signal generator circuit 10 reduces the noise coupled in an oscillating signal VP and an oscillating signal VN through the closed loop formed by the voltage regulator circuit 100, the oscillator circuit 200 and the feedback circuit 300.

The voltage regulator circuit 100 is configured to regulate a supply voltage VDD so as to generate a reference voltage V1. In this case, the voltage regulator circuit 100 regulates the supply voltage VDD according to a reference voltage V2 and a feedback voltage VF generate by the feedback circuit 300. In some embodiments, the voltage regulator circuit 100 is a linear regulator, e.g., a low dropout regulator (LDO). The oscillator circuit 200 is powered by the voltage regulator circuit 100 and configured to generate an oscillating signal VP and an oscillating signal VN respectively at an output terminal N1 and an output terminal N2 according to the reference voltage V1 and generate a sense voltage VC at a common mode node NC. The oscillating signal VP and the oscillating signal VN are a differential pair of signals. For example, the oscillator circuit 200 includes a common mode sensing circuit 210. The common mode sensing circuit 210 is coupled between the output terminal N1 and the output terminal N2 and configured to generate the sense voltage VC at the common mode node NC according to a common mode component of the oscillating signal VP and the oscillating signal VN. In other words, the sense voltage VC outputted from the common mode node NC can carry the common mode component of the oscillating signal VP and the oscillating signal VN, which may include the common mode noise present at the output terminal N1 and the output terminal N2. The feedback circuit 300 generates a feedback voltage VF according to the sense voltage VC and feeds the feedback voltage VF back to the voltage regulator circuit 100.

Figure 2:
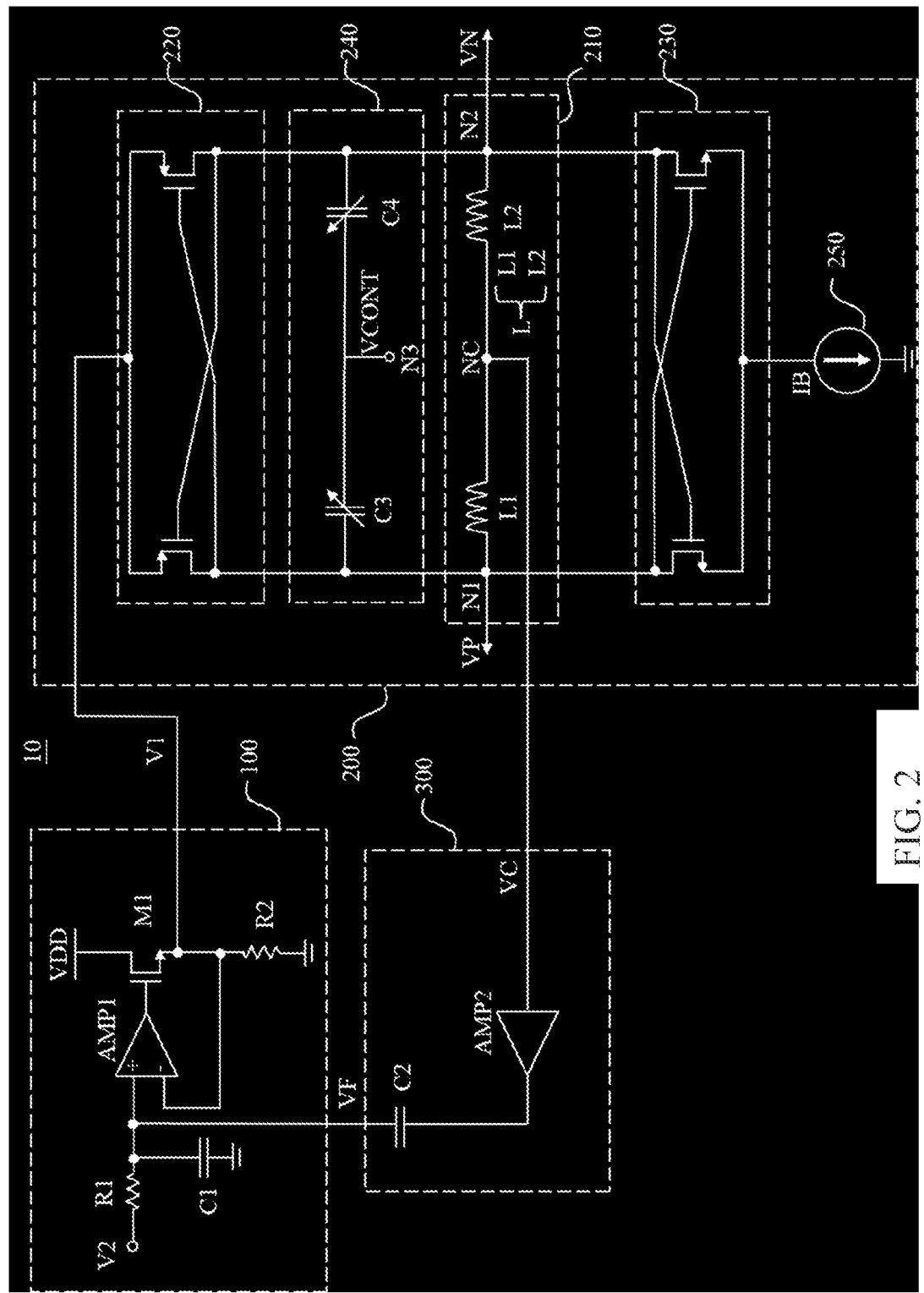
FIG. 2 is a schematic diagram illustrating components of an oscillating signal generator circuit according to some embodiments of the present application.

FIG. 2 is a schematic diagram illustrating components of the oscillating signal generator circuit 10 shown in FIG. 1, according to some embodiments of the present application.

The voltage regulator circuit 100 includes an amplifier AMP1, a transistor M1, a resistor R1, a resistor R2 and a capacitor C1. The first terminal of the resistor R1 is configured to receive the reference voltage V2, and the second terminal of the resistor R1 is coupled between the first terminal of the capacitor C1 and the first input terminal of the amplifier AMP1 (e.g., a positive-input terminal). The second terminal of the capacitor C1 is coupled to a reference voltage, such as the ground voltage. The output terminal of the amplifier AMP1 is coupled to the control terminal of the transistor M1, the first terminal of the transistor M1 is configured to receive a supply voltage VDD, the second terminal of the transistor M1 is coupled to the first terminal of the resistor R2 and the second input terminal of the amplifier AMP1 (e.g., a negative-input terminal), and the second terminal of the resistor R2 is coupled to a reference voltage, such as the ground voltage. In this case, the second terminal of the transistor M1 is configured to output the reference voltage V1. In some embodiments, the reference voltage V2 is an energy gap voltage.

In some embodiments, the oscillator circuit 200 is a voltage-controlled oscillator, which controls the oscillating signals VP, VN by means of the reference voltage V1, the control voltage VCONT and the current IB that it receives. The oscillator circuit 200 further includes a first cross-coupling transistor pair 220, a second cross-coupling transistor pair 230, a voltage control circuit 240 and a current source 250. As shown in FIG. 2, the common mode sensing circuit 210, the first cross-coupling transistor pair 220, the second cross-coupling transistor pair 230 and the voltage control circuit 240 are respectively coupled to the output terminal N1 and the output terminal N2. The first cross-coupling transistor pair 220 is configured to receive the reference voltage V1, and the second cross-coupling transistor pair 230 is coupled to the current source 250.

In the present embodiment, the common mode sensing circuit 210 may include an oscillator element L, which is coupled between the output terminal N1 and the output terminal N2, wherein the common mode node NC locates at the center of the oscillator element L. In some embodiments, the oscillator element L is an inductor, wherein the inductance between the output terminal N1 and the common mode node NC is substantially equal to the inductance between the output terminal N2 and the common mode node NC. For example, the common mode node NC is at the center tap of the inductor. In some embodiments, the oscillator element L includes two inductors L1 and L2, wherein the inductor L1 is coupled between the output terminal N1 and the common mode node NC, and the inductor L2 is coupled between the output terminal N2 and the common mode node NC. The inductor L1 and the inductor L2 may have the same or substantially the same inductance.

The voltage control circuit 240 includes a variable capacitor C3 and a variable capacitor C4. The first terminal of the variable capacitor C3 is coupled to the output terminal N1, the second terminal of the variable capacitor C3 is coupled to the first terminal of the variable capacitor C4 and a voltage control terminal N3, the second terminal of the variable capacitor C4 is coupled to the output terminal N2. The oscillator circuit 200 adjusts the frequencies of the oscillating signal VP and the oscillating signal VN by means of the control voltage VCONT received by the voltage control terminal N3 and the capacitance of the variable capacitors C3, C4.

It is noted that the inductor L1, the inductor L2, the variable capacitor C3 and the variable capacitor C4 may be used as at least a portion of the inductor-capacitor resonant cavity (LC tank) of the oscillator circuit 200. The common mode sensing circuit 210 can be considered as an oscillator element within the inductor-capacitor resonant cavity using the oscillator circuit 200 repetitively. However, the arrangement of the above-mentioned common mode sensing circuit 210 is illustrative only, and various arrangements of the common mode sensing circuit 210 are all within the consideration and scope of the present application. In some embodiments, the common mode sensing circuit 210 further includes a high-resistance resistor (not shown in the drawing) coupled between the output terminal N1 and the output terminal N2. The common mode node NC locates at the center of the high-resistance resistor; that is, the resistance of the output terminal N1 with respect to the common mode node NC substantially equals to the resistance of the output terminal N2 with respect to the common mode node NC. The sense voltage VC that the common mode sensing circuit 210 outputted from the common mode node NC may carry the common mode component of the oscillating signal VP and the oscillating signal VN, so that the feedback circuit 300 can obtain the common mode component between the oscillating signal VP and the oscillating signal VN by means of the common mode node NC. In some embodiments, the common mode sensing circuit 210 may further includes more capacitors that are connected in series between the output terminals N1, N2, wherein the capacitance between the output terminal N1 and the common mode node NC substantially equals to the capacitance between the output terminal N2 and the common mode node NC. In some embodiments, the common mode sensing circuit 210 may use an oscillator element other than the inductor L1, the inductor L2, the variable capacitor C3 and the variable capacitor C4, to sense the common mode component between the oscillating signal VP and the oscillating signal VN. For example, the common mode sensing circuit 210 may receive the oscillating signal VP and the oscillating signal VN and then average the oscillating signal VP and the oscillating signal VN, so as to generate the sense voltage VC. Such structure variations all fall within the scope of the present application.

The feedback circuit 300 includes an amplifier AMP2 and a capacitor C2. The input terminal of the amplifier AMP2 is coupled to the common mode node NC and is used as the input terminal of the feedback circuit 300, configured to receive the sense voltage VC. The output terminal of the amplifier AMP2 is coupled to the first terminal of the capacitor C2, and the second terminal of the capacitor C2 is used as the output terminal of the feedback circuit 300 and configured to output the feedback voltage VF. The second terminal of the capacitor C2 is coupled to the node where the first input terminal of the amplifier AMP1, the second terminal of the resistor R1 and the first terminal of the capacitor C1 in the voltage regulator circuit 100 intersect. In other words, the voltage on the first input terminal of the amplifier AMP1 includes not only the component of the reference voltage V2 but also the component of the feedback voltage VF.

In some embodiments, the oscillating signals VP, VN outputted by the oscillator circuit 200 may represent as a function of the supply voltage VDD and the current IB; hence, both the noise coupled in the supply voltage VDD and the noise coupled in the current source 250 affect the oscillating signal VP and the oscillating signal VN. In some other embodiments, the noise generated by the feedback circuit 300 and/or the noise generated by the chip where the oscillator circuit 200 locates may also affect the oscillating signal VP and the oscillating signal VN. The oscillating signal generator circuit 10 according to the present application is configured to decrease at least a portion of the above-mentioned noise, which is discussed in detail below.

Figure 3:
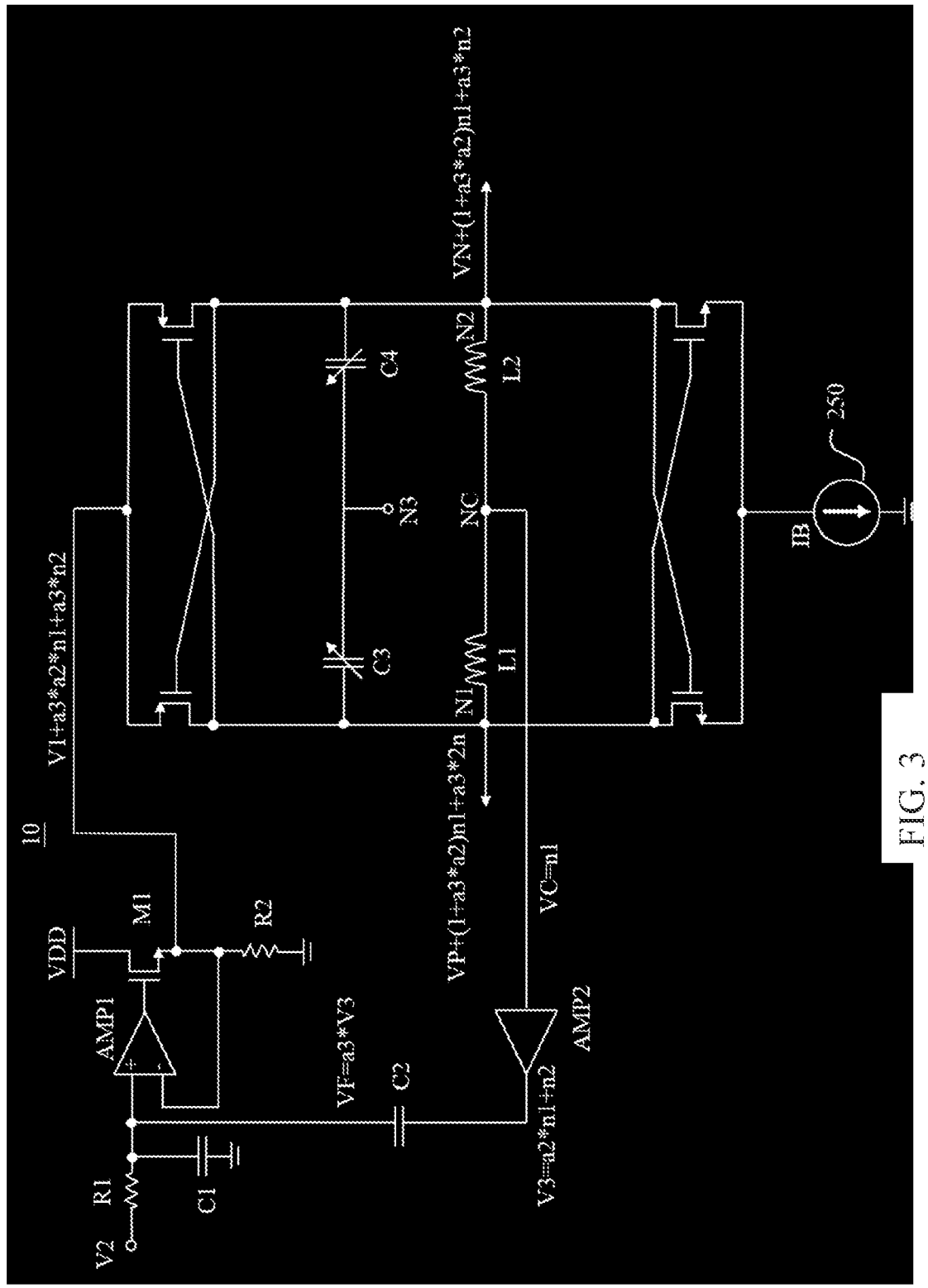
FIG. 3 is a schematic diagram illustrating the operation of an oscillating signal generator circuit according to some embodiments of the present application.

FIG. 3 is a schematic diagram illustrating the operation of the oscillating signal generator circuit 10 shown in FIG. 2, and the following description is directed to both FIG. 2 and FIG. 3. As shown in FIG. 3, the noise n1 of the current source 250 is present in the oscillating signal VP and the oscillating signal VN at the output terminal N1 and the output terminal N2 in the form of common mode. Because the oscillating signal VP outputted by the output terminal N1 and the oscillating signal VN outputted by the output terminal N2 are a differential pair of signals, and because the common mode node NC locates at the symmetrical center of the inductor between the output terminal N1 and the output terminal N2, the sense voltage VC outputted by the common mode node NC can carry the information related to the common mode component between the oscillating signal VP and the oscillating signal VN. In the present embodiment, the voltage level of the sense voltage VC outputted by the common mode node NC may equal to or substantially equal to an arithmetic average of the signal level of the oscillating signal VP and the signal level of the oscillating signal VN. Due to the characteristics of the cross-coupling on the oscillator circuit 200, since the average of the oscillating signal VP and the oscillating signal VN serving as the differential pair of signals is substantially the common mode noise (i.e., noise n1) present at the output terminal N1 and the output terminal N2, the sense voltage VC is equivalent to the common mode noise (i.e., noise n1) present at the output terminal N1 and the output terminal N2. Next, the sense voltage VC generates the auxiliary voltage V3 via the amplification of the amplifier AMP2, The auxiliary voltage V3 can be expressed as: $a2*VC+n2$ (i.e., $a2*n1+n2$), wherein a2 and n2 are the gain values of the amplifier AMP2 and the noise of the amplifier AMP2, respectively.

Since the reference voltage V2 is a direct current (DC) voltage, when analyzing the oscillating signal generator circuit 10 in view of a small signal model, the resistor R1 has a high-resistance and can be considered as an open loop, the feedback voltage VF received by the first input terminal of the amplifier AMP1 can be expressed as the partial voltage of the capacitor C1 and the capacitor C2 on the auxiliary voltage V3, which is expressed as $a3*V3$ (i.e., $a3*a2*n1+a3*n2$) in FIG. 3, wherein the partial voltage ratio a3 equals to a value of the capacitance of the capacitor C2 divided by the sum of the capacitances of the capacitor C1 and the capacitor C2.

In some embodiments, the gain of the closed loop formed by the amplifier AMP1 and the transistor M1 is 1, and therefore, the feedback voltage VF is transmitted to the control terminal of the transistor M1. In the small signal model, the transistor M1 is considered as a common drain transistor, therefore, the feedback voltage VF at the gate terminal (i.e., the control terminal) is transmitted to the second terminal of the transistor M1 and is coupled in the reference voltage V1, which can be expressed as $a3*a2*n1+a3*n2$ (see, FIG. 3), When the oscillator circuit 200 receives the reference voltage V1 carrying the noise $a3*a2*n1+a3*n2$, the noise $a3*a2*n1+a3*n2$ is also coupled in the oscillating signal VP and the oscillating signal VN at the output terminal N1 and the output terminal N2. According to the abovementioned circuit operations, the noises coupled in the oscillating signal VP and the oscillating signal VN can be divided into the noise n1 from current source and the noise $a3*a2*n1+a3*n2$ fed back from the feedback circuit 200. Therefore, the noise coupled in the oscillating signal VP and the oscillating signal VN is $n1+a3*a2*n1+a3*n2$. For simplicity, the noise coupled in the oscillating signal VP and the oscillating signal VN is expressed as $(1+a3*a2)n1+a3*n2$ (see, FIG. 3).

In some embodiments, the oscillating signal generator circuit 10 is configured to cancel the noise n1 of the current source; hence, it is feasible to set the coefficient preceding the noise n1 (i.e., $1+a3*a2$) as 0. In this way, the noises n1 in the oscillating signal VP and the oscillating signal VN can be canceled, only a portion of the noise (the noise $a3*n2$) is left.

When $(1+a3*a2)$ is set as 0, the value of $a3*a2$ equals to −1. Because the partial voltage ratio a3 is always positive, when the gain value a2 of the amplifier AMP2 is set as a negative value, the product of the partial voltage ratio a3 times the gain value a2 is −1. In this case, once the capacitances of the capacitor C1 and the capacitor C2 are determined, the gain value a2 is also determined. For example, when the capacitance of the capacitor C1 equals to the capacitance of the capacitor C2, a3 equals to 0.5, and therefore, the gain value a2 equals to −2. In some embodiments, the capacitance of the capacitor C1 is much greater than the capacitance of the capacitor C2. For example, when the ratio between the capacitance of the capacitor C1 and the capacitance of the capacitor C2 is 9:1, then a3 equals to 0.1, and therefore the gain value a2 is −10 approximately.

Moreover, when the $(1+a3*a2)$ is set as 0, the noise left to be coupled in the oscillating signal VP and the oscillating signal VN is $a3*n2$. In view of the foregoing, decreasing the partial voltage ratio a3 can inhibit the noise $a3*n2$ that is left. Also, $a3*n2$ can be rewritten as $-n2/a2$ (because $a3*a2=-1$), and therefore, when the absolute value of the gain value a2 of the amplifier AMP2 increases, the noise $-n2/a2$ coupled in the oscillating signal VP and the oscillating signal VN can be better inhibited.

Figure 4:
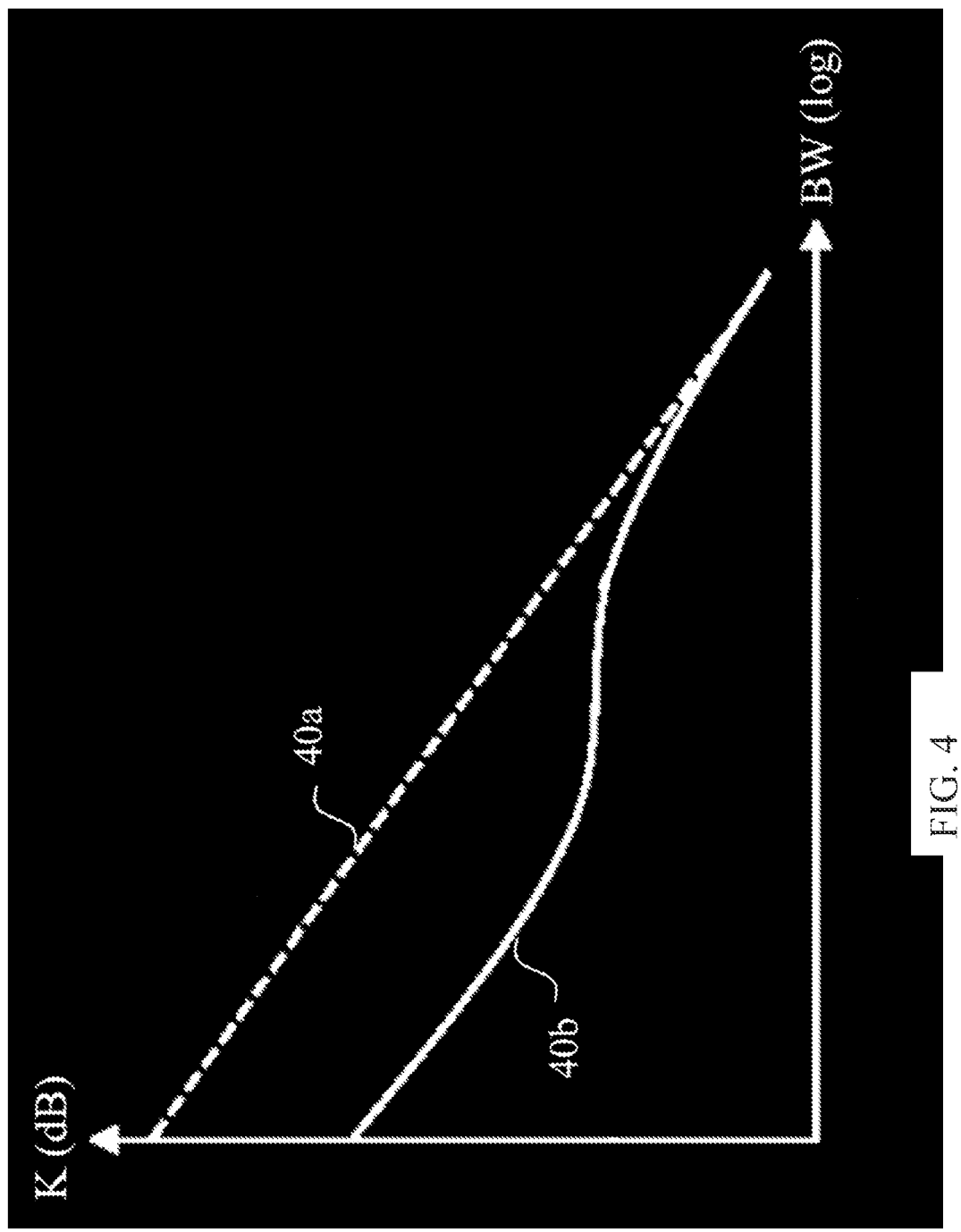
FIG. 4 is a schematic diagram shows the performance of an oscillator circuit of the oscillating signal generator circuit in FIG. 2, according to some embodiments of the present application.

In some embodiments, as shown in FIG. 4, the sensitive gain K of the oscillator circuit 200 is inversely proportional to the noise cancellation work bandwidth BW. In order to decrease the noise cancellation work bandwidth BW so as to cancel the noise in a specific frequency range, the sensitive gain K can be increased. In FIG. 4, line 40a represents the state-of-the-art circuit which does not use a closed loop formed by the voltage regulator circuit 100, the oscillator circuit 200 and the feedback circuit 300 to cancel the noise, whereas the curved line 40b represents the oscillator circuit 200 provided by the present application. The oscillating signal generator circuit 10 provided by the present application uses the closed loop formed by the voltage regulator circuit 100, the oscillator circuit 200 and the feedback circuit 300 to effectively cancel the noise n1 of the current source, and hence, a smaller noise cancellation work bandwidth BW can be achieved without the need to increase the sensitive gain K. In some embodiments, the noise cancellation work bandwidth BW represented by the curved line 40b is in the range of about several hundreds of KHz to several dozens of MHz.

In some embodiments, it is difficult for the oscillating signal generator circuit 10 to predict the noise n3 coupled in the reference voltage V1 as a result of the supply voltage VDD. Therefore, the closed loop formed by the voltage regulator circuit 100, the oscillator circuit 200 and the feedback circuit 300 can cancel the noise n3 effectively, so that the reference voltage V1 does not carry the component of the noise n3, see below for detailed discussion.

Figure 5:
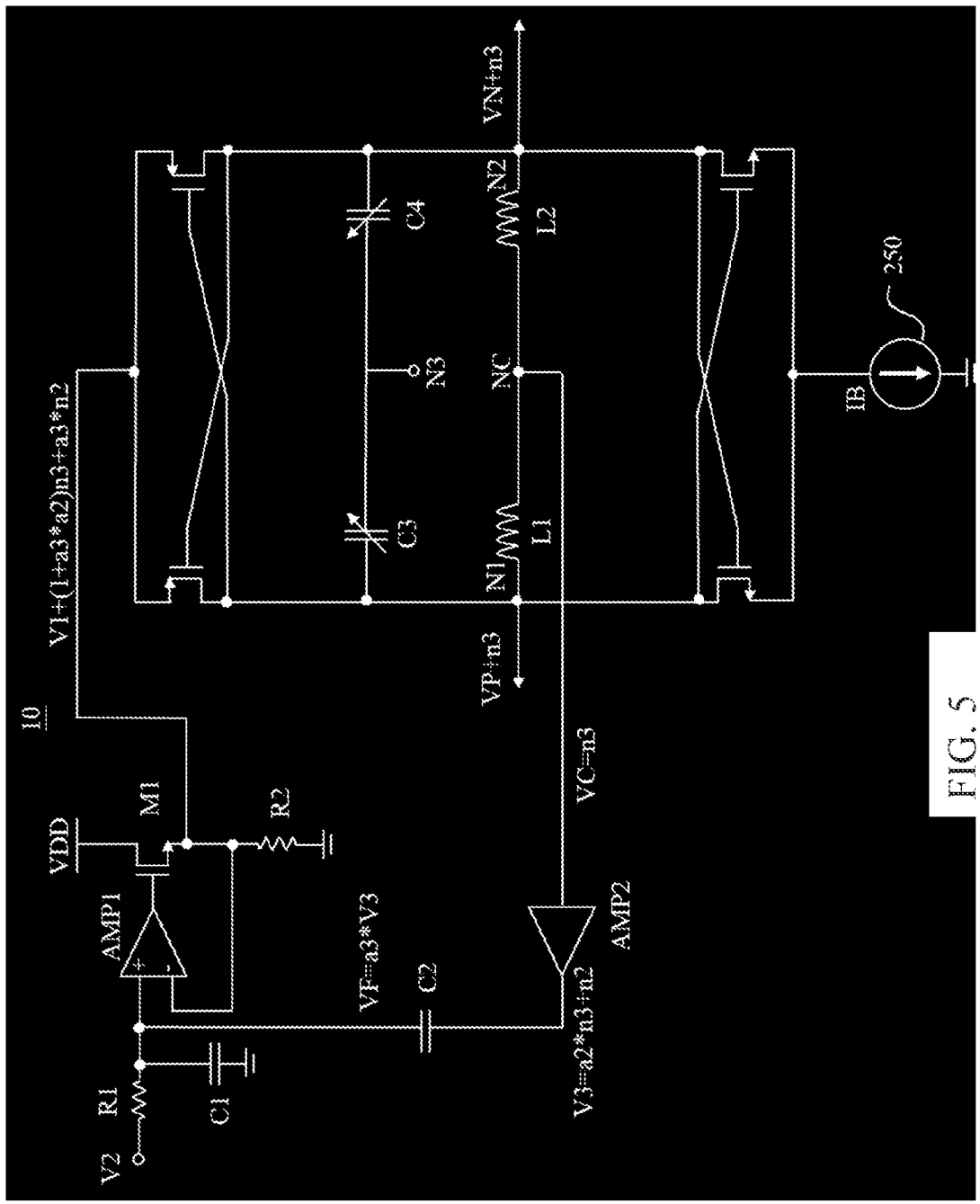
FIG. 5 is a schematic diagram illustrating the operation of an oscillating signal generator circuit according to some other embodiments of the present application.

FIG. 5 is a schematic diagram illustrating the operation of the oscillating signal generator circuit 10; reference is made to both FIG. 2 and FIG. 5. As shown in FIG. 5, the noise coupled in the supply voltage VDD is also coupled in the reference voltage V1 through the transistor M1 and is present at the output terminal N1 and the output terminal N2 (that is, the noise n3 shown in FIG. 5) in the form of common mode. When the oscillating signals VN, VP includes the noise n3, the feedback circuit 300 can obtain the sense voltage VC including the noise n3 at common mode node by means of the common mode sensing circuit 210. Similar to the operation on the noise n1 shown in FIG. 3, the closed loop formed by the voltage regulator circuit 100, the oscillator circuit 200 and the feedback circuit 300 also performs a similar operation on the noise n3; that is, the amplifier AMP2 generates the auxiliary voltage V3 (a2*n3+n2), and the feedback circuit generates the feedback voltage VF (a3*V3). When the voltage regulator circuit 100 generates the reference voltage V1, the noise coupled in the reference voltage V1 includes the noise n3 that is originally coupled in the supply voltage VDD and the noise a3*a2*n3+a3*n2 that is fed back from the feedback voltage VF. For simplicity, the noise coupled in the reference voltage V1 can be re-written as (1+a3*a2)n3+a3*n2 (see, FIG. 5).

Similar to the description with respect to FIG. 3, the coefficient (1+a3*a2) preceding the noise n3 can be set as 0 in order to cancel the noise n3, detailed calculations and relationships are omitted herein for the sake of brevity.

In other embodiments, the oscillating signal generator circuit 10 is further configured to cancel the noise n4 generated by the chip where the oscillator circuit 200 locates. In some embodiments, the noise n1, noise n2 and noise n3 are coupled in the oscillating signals VN, VP and change the bias points of the variable capacitors C3, C4 as well as the frequencies of the oscillating signals VN, VP, thereby jeopardizing the phase noise. Moreover, the noise n4 generated by the chip where the oscillator circuit 200 locates is adjacent to the witching noise of the low frequency of the digital circuit; further, the noise n4 is also coupled in the oscillating signals VN, VP by means of the output terminal N1, N2, thereby further deteriorating the phase noise of the oscillating signals VN, VP.

In some conventional technologies, the circuit system would use lower supply voltage (e.g., from 3V to 1.3V) in order to decrease the power of such circuit system. However, decreasing the supply voltage would also worsen the power supply ripple rejection (PSRR) of the power source of the regulator in the circuit system, thereby increasing the noise of the voltage supplied by the regulator. The sensitive gain of the oscillator can be decreased in order to decrease the noise. However, as the sensitive gain is decreased, the frequency modulation range is also decreased. Therefore, it is difficult to have both the satisfactory sensitive gain and frequency modulation range at the same time in the prior art.

Figure 6:
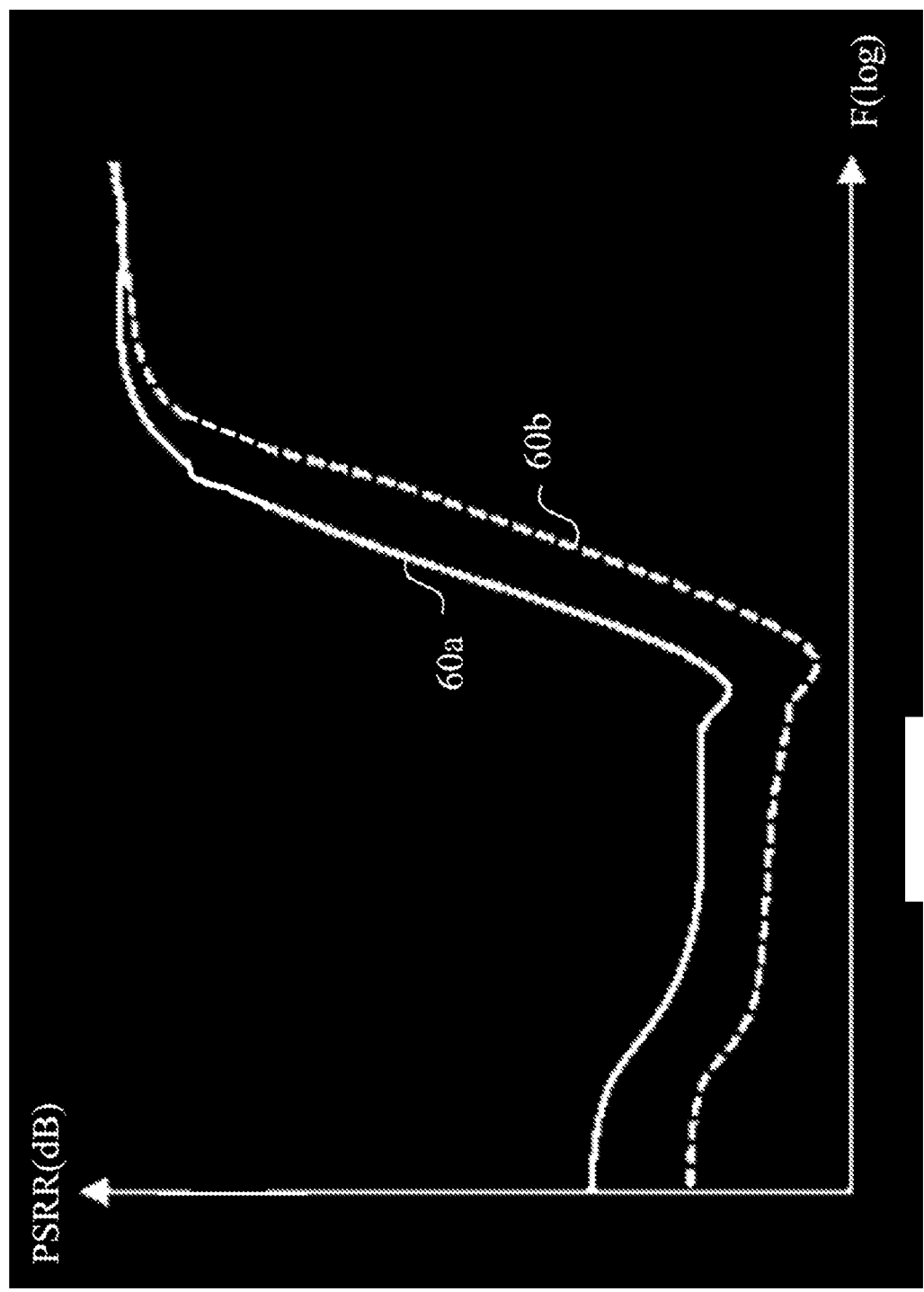
FIG. 6 is a schematic diagram shows the performance of a voltage regulator circuit of the oscillating signal generator circuit in FIG. 2, according to some embodiments of the present application.

FIG. 6 is a schematic diagram shows the performance of the voltage regulator circuit 100 in FIG. 2. The lower the PSRR of the voltage regulator circuit 100, the better the performance of that the voltage regulator circuit 100 inhibits the noise. The curved line 60a represents the state-of-the-art circuit which does not use a closed loop formed by the voltage regulator circuit 100, the oscillator circuit 200 and the feedback circuit 300 to cancel the noise, whereas the curved line 60b represent the voltage regulator circuit 100 provided by the present application. As can be seen in FIG. 6, the voltage regulator circuit 100 can achieve a lower PSRR at the same working frequency F because it uses the noise cancellation method according to the present application.

Compared with the prior art, the oscillating signal generator circuit 10 provided by present application can use a lower supply voltage VDD and reduce the noise in the circuit without decreasing the sensitive gain K of the oscillator circuit 200, so as to achieve a satisfactory sensitive gain K and frequency modulation range at the same time.

What is claimed is:

1. An oscillating signal generator circuit, comprising:
   an oscillator circuit, having a first output terminal and a second output terminal, and configured to generate a first oscillating signal and a second oscillating signal respectively at the first output terminal and the second output terminal according to a first reference voltage, the first oscillating signal and the second oscillating signal being a differential pair of signals, wherein the oscillator circuit includes a common mode sensing circuit coupled between the first output terminal and the second output terminal, and the common mode sensing circuit is configured to sense a common mode component of the first oscillating signal and the second oscillating signal so as to generate a sense voltage;
   a feedback circuit, coupled to the common mode sensing circuit and configured to provide a negative gain to the sense voltage so as to generate a feedback voltage; and
   a voltage regulator circuit, coupled to the oscillator circuit and the feedback circuit, and configured to regulate a supply voltage according to the feedback voltage and a second reference voltage so as to generate the first reference voltage.

2. The oscillating signal generator circuit of claim 1, wherein the common mode sensing circuit comprises an oscillator element coupled between the first output terminal and the second output terminal, wherein the oscillator element is configured to generate the sense voltage at a common mode node of the oscillator element according to the common mode component.

3. The oscillating signal generator circuit of claim 2, wherein the oscillator element is an inductor, and an inductance between the common mode node and the first output terminal substantially equals to an inductance between the common mode node and the second output terminal.

4. The oscillating signal generator circuit of claim 1, wherein a voltage level of the sense voltage is an arithmetic average of a signal level of the first oscillating signal and a signal level of the second oscillating signal.

5. The oscillating signal generator circuit of claim 1, wherein the voltage regulator circuit comprises:
   a first amplifier;
   a first resistor, wherein a first terminal of the first resistor is arranged to receive the second reference voltage, and a second terminal of the first resistor is coupled to a first input terminal of the first amplifier;

a second resistor, wherein a first terminal of the second resistor is coupled to a second input terminal of the first amplifier, and a second terminal of the second resistor is connected to ground; and a pass transistor, wherein a control terminal of the pass transistor is coupled to an output terminal of the first amplifier, a first terminal of the pass transistor is configured to receive the supply voltage, a second terminal of the pass transistor is coupled to the second input terminal of the first amplifier, and the second terminal of the pass transistor is configured to output the first reference voltage.

6. The oscillating signal generator circuit of claim 5, wherein the feedback circuit comprises:

a second amplifier, configured to amplify the sense voltage to generate an auxiliary voltage; and a first capacitor, wherein a first terminal of the first capacitor is configured to receive the auxiliary voltage, and a second terminal of the first capacitor is configured to output the feedback voltage.

7. The oscillating signal generator circuit of claim 6, wherein the second amplifier has the negative gain value.

8. The oscillating signal generator circuit of claim 6, wherein the voltage regulator circuit further comprises:

a second capacitor, wherein a first terminal of the second capacitor is coupled to the first input terminal of the first amplifier and the second terminal of the first capacitor, and a second terminal of the second capacitor is connected to the ground.

9. The oscillating signal generator circuit of claim 8, wherein a gain value of the first amplifier is determined based on a capacitance ratio between the first capacitor and the second capacitor.

10. The oscillating signal generator circuit of claim 1, wherein the common mode component comprises a common mode noise present at the first output terminal and the second output terminal.

11. An oscillating signal generator circuit, comprising:

a first amplifier;

a pass transistor, wherein a control terminal of the pass transistor is coupled to an output terminal of the first amplifier, a first terminal of the pass transistor is configured to receive a supply voltage, and a second terminal of the pass transistor is configured to output a first reference voltage;

an oscillator circuit, wherein an input terminal of the oscillator circuit is configured to receive the first reference voltage, a first output terminal and a second output terminal of the oscillator circuit are configured to output a first oscillating signal and a second oscillating signal, respectively, and a common mode node of the oscillator circuit is configured to output a sense voltage, wherein the sense voltage has a common mode component of the first oscillating signal and the second oscillating signal; and a feedback circuit, wherein an input terminal of the feedback circuit is coupled to the common mode node, and an output terminal of the feedback circuit is coupled to a first input terminal of the first amplifier.

12. The oscillating signal generator circuit of claim 11, wherein the oscillator circuit comprises an oscillator element coupled between the first output terminal and the second output terminal, wherein the oscillator element is configured to generate the sense voltage at the common mode node of the oscillator element according to the common mode component.

13. The oscillating signal generator circuit of claim 12, wherein the oscillator element comprises a first inductor and a second inductor, wherein the first inductor is coupled between the first output terminal and the common mode node, and the second inductor is coupled between the second output terminal and the common mode node.

14. The oscillating signal generator circuit of claim 13, wherein an inductance of the first inductor substantially equals to an inductance of the second inductor.

15. The oscillating signal generator circuit of claim 11, wherein the feedback circuit comprises:

a second amplifier, wherein an input terminal of the second amplifier is used as the input terminal of the feedback circuit; and a first capacitor, wherein a first terminal of the first capacitor is coupled to an output terminal of the second amplifier, and a second terminal of the first capacitor is used as the output terminal of the feedback circuit.

16. The oscillating signal generator circuit of claim 15, wherein the second amplifier corresponds to a negative gain value.

17. The oscillating signal generator circuit of claim 15, further comprising a second capacitor, wherein a first terminal of the second capacitor is coupled to the first input terminal of the first amplifier and the second terminal of the first capacitor, and a second terminal of the second capacitor is connected to ground.

18. The oscillating signal generator circuit of claim 17, wherein a gain value of the second amplifier is determined based on a capacitance ratio between the first capacitor and the second capacitor.

19. The oscillating signal generator circuit of claim 17, further comprising:

a first resistor, wherein a first terminal of the first resistor is configured to receive a second reference voltage, and a second terminal of the first resistor is coupled to the first input terminal of the first amplifier; and a second resistor, wherein a first terminal of the second resistor is coupled to a second input terminal of the first amplifier and the second terminal of the pass transistor, and a second terminal of the second resistor is connected to the ground.

20. The oscillating signal generator circuit of claim 11, wherein the common mode component comprises a common mode noise present at the first output terminal and the second output terminal.

* * * * *